(12) United States Patent
Chang et al.

(10) Patent No.: US 8,545,990 B2
(45) Date of Patent: Oct. 1, 2013

(54) COATED ARTICLE AND METHOD FOR MANUFACTURING

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Man-Xi Zhang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 180 days.

(21) Appl. No.: 13/207,982

(22) Filed: Aug. 11, 2011

(65) Prior Publication Data

US 2012/0135269 A1 May 31, 2012

(30) Foreign Application Priority Data

Nov. 26, 2010 (CN) .......................... 2010 1 0560956

(51) Int. Cl.
*B32B 15/04* (2006.01)

(52) U.S. Cl.
USPC ........................... 428/627; 428/646; 428/649

(58) Field of Classification Search
None
See application file for complete search history.

(56) References Cited

U.S. PATENT DOCUMENTS

| | | | | |
|---|---|---|---|---|
| 6,159,618 A | * | 12/2000 | Danroc et al. | 428/610 |
| 6,248,401 B1 | * | 6/2001 | Chiang et al. | 427/96.8 |
| 2011/0183156 A1 | * | 7/2011 | Song | 428/649 |

* cited by examiner

*Primary Examiner* — Gwendolyn Blackwell
*Assistant Examiner* — Seth Dumbris
(74) *Attorney, Agent, or Firm* — Altis & Wispro Law Group, Inc.

(57) ABSTRACT

A coated article includes a substrate, a first magnesium-tin alloy layer, a tin layer, a second magnesium-tin alloy layer, a magnesium layer and a magnesium-nitrogen layer. The substrate is made of magnesium or a magnesium alloy. The substrate made of magnesium or magnesium alloy. The first magnesium-tin alloy layer formed on the substrate. The tin layer formed on the first magnesium-tin alloy layer. The second magnesium-tin alloy layer formed on the tin layer. The magnesium layer formed on the second magnesium-tin alloy layer. The magnesium-nitrogen layer formed on the magnesium layer.

3 Claims, 2 Drawing Sheets

COATED ARTICLE AND METHOD FOR MANUFACTURING

CROSS-REFERENCE TO RELATED APPLICATIONS

This application is one of the three related co-pending U.S. patent applications listed below. All listed applications have the same assignee. The disclosure of each of the listed applications is incorporated by reference into the other listed applications.

| Application Number | Title | Inventors |
|---|---|---|
| 12/968,406 | HOUSING AND METHOD FOR MANUFACTURING HOUSING | HSIN-PEI CHANG et al. |
| 12/968,412 | HOUSING AND METHOD FOR MANUFACTURING HOUSING | HSIN-PEI CHANG et al. |
| 13/207,982 | COATED ARTICLE AND METHOD FOR MANUFACTURING | HSIN-PEI CHANG et al. |

BACKGROUND

1. Technical Field

The exemplary disclosure generally relates to coated articles and a method for manufacturing the coated articles.

2. Description of Related Art

With the development of wireless communication and information processing technology, portable electronic devices, such as mobile telephones and electronic notebooks are now widely used. Magnesium and magnesium alloys have good heat dissipation and can effectively shield electromagnetic interference. Therefore, the magnesium and magnesium alloy are widely used to manufacture the coated articles of the portable electronic device. However, magnesium and magnesium alloy have a lower erosion resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
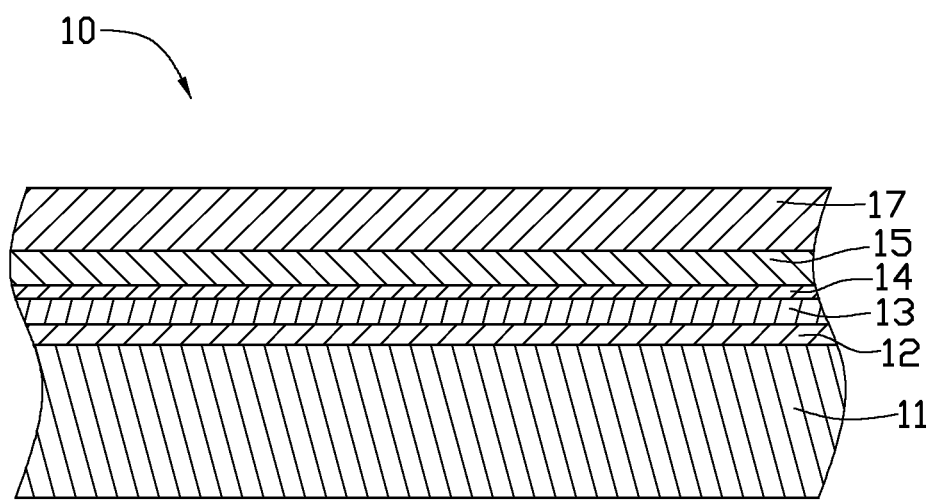
FIG. 1 is a cross-sectional view of an exemplary embodiment of a coated article.

FIG. 1 shows an exemplary embodiment of a coated article 10. The coated article 10 includes a substrate 11, a first magnesium-tin (Mg—Sn) alloy layer 12, a tin (Sn) layer 13, a second magnesium-tin alloy layer 14, a magnesium (Mg) layer 15 and a magnesium-nitrogen (Mg—N) layer 17. The substrate is made of magnesium or a magnesium alloy. The first magnesium-tin alloy layer 12 is formed on the substrate 11. The tin layer 13 is formed on the first magnesium-tin alloy layer 12. The magnesium layer 15 is formed on the tin layer 13. The magnesium-nitrogen layer 17 is deposited on the magnesium layer 15.

The magnesium layer 15 has a thickness of about 0.2 micrometer (μm) to about 0.5 μm. The magnesium-nitrogen layer 17 has a thickness of about 0.2 μm to about 2.0 μm.

Figure 2:
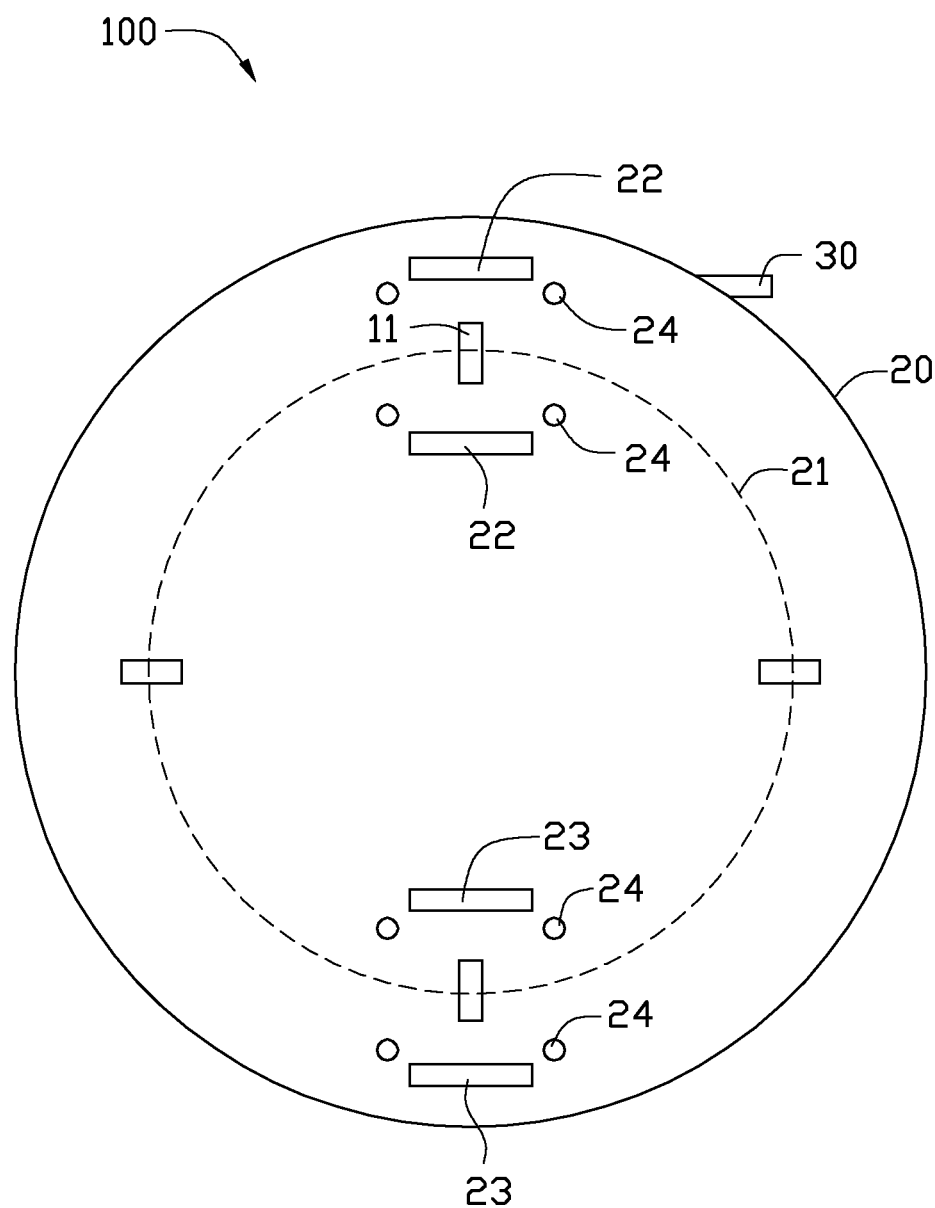
FIG. 2 is a schematic view of a vacuum sputtering coating machine for manufacturing the coated article in FIG. 1.

Referring to FIG. 2, a method for manufacturing the coated article 10 may includes at least the following steps:

Providing a substrate 11. The substrate 11 may be made of magnesium or magnesium alloy and may be molded by a punching method.

Pretreating the substrate 11 by washing with a solution (e.g., Alcohol or Acetone) in an ultrasonic cleaner to remove impurities and contaminations, such as grease, or dirt, the substrate 11 is then dried.

Providing a vacuum sputtering coating machine 100. The vacuum sputtering coating machine 100 includes a sputtering coating chamber 20 and a vacuum pump 30 connecting to the sputtering coating chamber 20. The vacuum pump 30 is used to evacuate the sputtering coating chamber 20. The vacuum sputtering coating machine 100 further includes a rotating bracket 21, two first targets 22, two second targets 23 and a plurality of gas inlets 24. The rotating bracket 21 rotates the substrate 11 in the sputtering coating chamber 20 relative to the first targets 22 and the second targets 23. The two first targets 22 face to each other, and are located on opposite sides of the rotating bracket 21, and the same arrangement of the two first targets 22 are also applied to the two second targets 23. In this exemplary embodiment, the first targets 22 are tin targets, the second targets 23 are magnesium targets.

Cleaning the substrate 11 by plasma cleaning process. The substrate 11 is retained on a rotating bracket 25 in a sputtering coating chamber 21. The vacuum level inside the sputtering coating chamber 21 is set to about $8.0*10^{-3}$ Pa. Argon gas is fed into the sputtering coating chamber 21 at a flux rate about 300 Standard Cubic Centimeters per Minute (sccm) to about 600 sccm from the gas inlets 27. A bias voltage applied to the substrate 11 may be between about −300 volts (V) and about −800 volts. The argon particles strike against and clean the surface of aluminum-based targets 23. Plasma cleaning the substrate 11 may take from about 3 min to about 10 min.

Depositing a tin layer 13 on the pretreated substrate 11. The inside of the sputtering coating chamber is heated to about 100° C. (degrees Celsius) to about 150° C. Argon may be used as a working gas and is fed into sputtering coating chamber 20 at a flow rate of about 100 sccm to about 300 sccm. Power is applied to the first targets 22 fixed in the sputtering coating chamber 20 are evaporated at a power between about 5 kW to about 10 kW, and the substrate 11 may have a negative bias voltage of about −50 V to about −300 V to deposit the tin layer 13 on the substrate 11. Deposition of the tin layer 13 may take from about 10 min to about 60 min.

During deposition of the tin layer 13, the first magnesium-tin alloy layer 12 is formed between the tin layer 13 and the substrate 11, in such a way that the tin in the tin layer 13 diffuse toward the substrate 11. The first magnesium-tin alloy layer 12 can improve the electrochemically potential of the coated article 10 to prevent the coated article 10 from electrochemically eroding.

Depositing a magnesium layer 15 on the tin layer 13. The inside of the sputtering coating chamber is heated to about 100° C. (degrees Celsius) to about 150° C. Argon (Ar) may be used as a working gas and is fed into sputtering coating chamber 20 at a flow rate of about 100 sccm to about 300 sccm. Power is applied to the second targets 23 fixed in the sputtering coating chamber 20 are evaporated at a power between about 5 kW to about 10 kW, and the substrate 11 may have a negative bias voltage of about −50 V to about −300 V to deposit the magnesium layer 15 on the tin layer 13. Deposition of the magnesium layer 15 may take from about 10 min to about 30 min.

During deposition of the magnesium layer 15, the second magnesium-tin alloy layer 14 is formed between the tin layer 13 and the magnesium layer 15, in such a way that the tin in the tin layer 13 diffuses toward the magnesium layer 15. The second magnesium-tin alloy layer 14 can improve the electrochemically potential of the coated article 10 to prevent the coated article 10 from electrochemically eroding.

Depositing a magnesium-nitrogen layer 17 on the magnesium layer 15. The magnesium-nitrogen layer 17 is magnesium-nitrogen (Mg—N) layer. The inside of the sputtering coating chamber is heated to about 100° C. (degrees Celsius) to about 150° C. Argon may be used as a working gas and is fed into sputtering coating chamber 20 at a flow rate of about 100 sccm to about 300 sccm. Nitrogen ($N_2$) may be used as reaction gas and have a flow rate of about 30 sccm to about 80 sccm. Power is applied to the second targets 23 fixed in the sputtering coating chamber 20 are evaporated at a power between about 5 kW to about 10 kW, and the substrate 11 may have a negative bias voltage of about −50 V to about −300 V to deposit the magnesium-nitrogen layer 17 on the magnesium layer 15. Deposition of the magnesium-nitrogen layer 17 may take from about 30 min to about 120 min.

During deposition of the tin layer 13 or the magnesium layer 15, the tin in the tin layer 13 diffuses toward the substrate 11 or the magnesium layer 15, which can improve the compactness of the substrate 11 or the magnesium-nitrogen layer 17. Furthermore, the magnesium-nitrogen layer 17 has a good erosion resistance. Thus, the erosion resistance of the coated article 10 can be improved. Additionally, the diffusing of the tin can enhance the bonding force between the layers formed on the substrate 11. Thus, the coated article 10 has a good wear resistance.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
a substrate made of magnesium or magnesium alloy;
a first magnesium-tin alloy layer formed on the substrate;
a tin layer formed on the first magnesium-tin alloy layer;
a second magnesium-tin alloy layer formed on the tin layer;
a magnesium layer formed on the second magnesium-tin alloy layer; and
a magnesium-nitrogen layer formed on the magnesium layer.

2. The coated article as claimed in claim 1, wherein the magnesium layer has a thickness of about 0.2 μm to about 0.5 μm.

3. The coated article as claimed in claim 1, wherein the magnesium-nitrogen layer has a thickness of about 0.2 μm to about 2.0 μm.

* * * * *